United States Patent
Yeh et al.

(10) Patent No.: US 6,873,176 B1
(45) Date of Patent: Mar. 29, 2005

(54) DIE-LEVEL PROBER

(75) Inventors: Chi-Hone Yeh, Hsin-Chu Hsien (TW);
Tung-Jung Hsu, Hsin-Chu Hsien (TW);
Sung-Pin Liu, Hsin-Chu Hsien (TW);
Chuang-Ming Yang, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/710,266

(22) Filed: Jun. 30, 2004

(51) Int. Cl.[7] ............................................. G01R 31/00
(52) U.S. Cl. ........................................................ 324/770
(58) Field of Search ................................ 324/761, 763, 324/764, 765, 766, 770, 727, 158.1, 754; 438/10, 16

(56) References Cited

U.S. PATENT DOCUMENTS 6,498,636 B1 * 12/2002 Mathew et al. ............. 349/187
6,664,864 B2 * 12/2003 Jiles et al. ................... 331/176

* cited by examiner

*Primary Examiner*—David Zarneke
*Assistant Examiner*—Trung Q. Nguyen
(74) *Attorney, Agent, or Firm*—Winston Hsu (57) ABSTRACT

A die-level prober testing an unpackaged liquid crystal on silicon (LCOS) display panel includes a tray and a probe card. The unpackaged LCOS display panel has at least a first contact pad and a second contact pad. Additionally, the tray includes at least a recession for situating the unpackaged LCOS display panel, and a conductive connecting structure electrically contacting the first contact pad. The probe card is utilized to electrically contact the connecting structure and the second contact pad for testing the unpackaged LCOS display panel.

23 Claims, 10 Drawing Sheets

DIE-LEVEL PROBER

BACKGROUND OF INVENTION

1. Field of the Invention

The present invention relates to a die-level prober, and more particularly, to a die-level prober for testing unpackaged liquid crystal on silicon (LCOS) display panels.

2. Description of the Prior Art

A liquid crystal on silicon (LCOS) display panel has the advantages of small pixels, high brightness, high resolution, simple and low-cost fabrication, a small volume and so forth. Accordingly, the LCOS display panel is used widely in video communication devices and video equipment. For example, the video communication devices could be portable-type cameras and web cellular phones, and the video equipment could be projection televisions and multimedia projectors.

Figure 1:
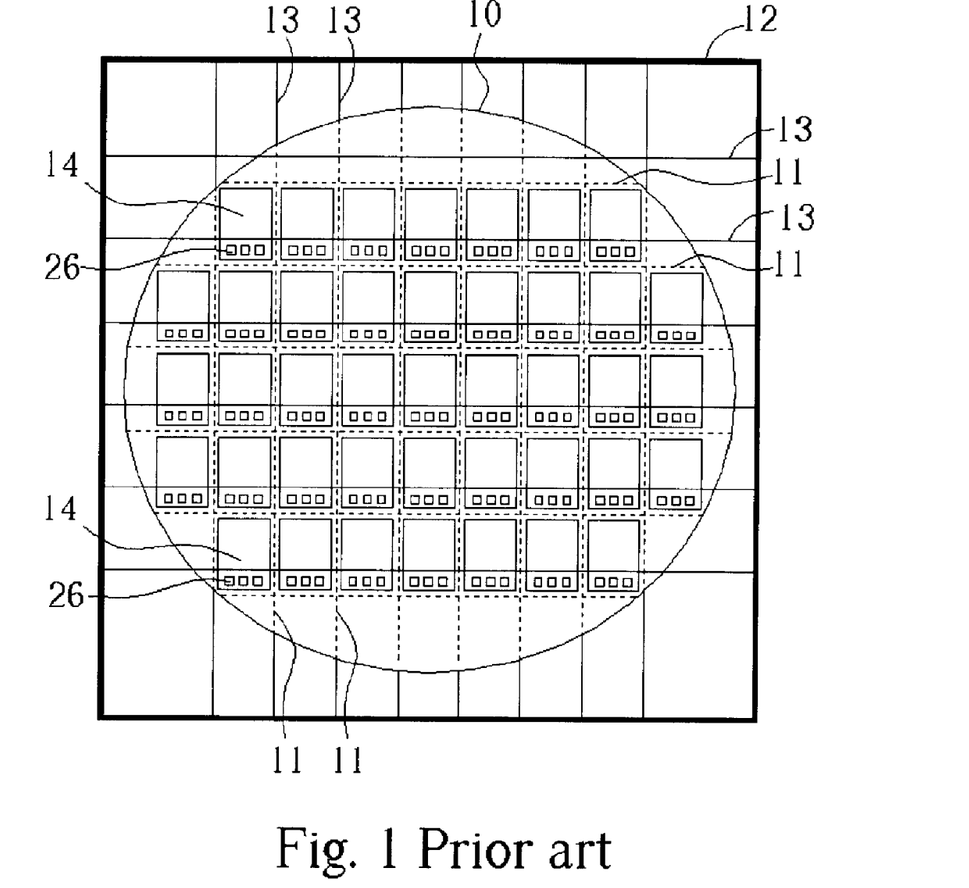
FIG. 1 shows a method for conventionally fabricating an LCOS display panel.
Figure 2:
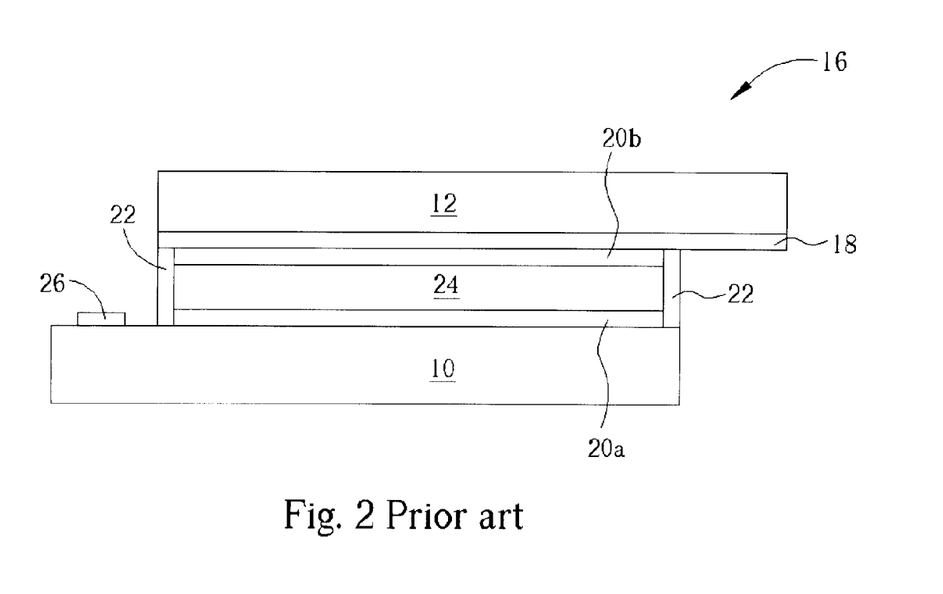
FIG. 2 shows a side view of an unpackaged LCOS display panel.

Please refer to FIG. 1 and FIG. 2. FIG. 1 shows a conventional method for fabricating an LCOS display panel. FIG. 2 shows a side view of an unpackaged LCOS display panel. Initially, with reference to FIG. 1 and FIG. 2, providing a semiconductor substrate 10, the semiconductor substrate 10 includes a plurality of dies 14 and a plurality of pads 26. Each die 14 contains an active matrix array (not shown) for a pixel circuit of an LCOS display panel. The pads 26 are electrically connected with the LCOS display panel to an exterior circuit. Next, an alignment film 20a is formed on a surface of the semiconductor substrate 10. A seal pattern 22 is then formed in the peripheral region of each die 14.

Next, a glass substrate 12 is provided in parallel with the semiconductor substrate 10. A conductive photo-resist layer 18 and an alignment film 20b are subsequently formed. The conductive photo-resist layer 18 is used as a common electrode and a color filter. The alignment films 20a and 20b are used for adjusting the orientation of liquid crystal molecules, and they include the materials polyimide resin, $SiO_2$, or $SiN_x$. Then, an assembly process is performed to bind the glass substrate 12 onto the semiconductor substrate 10 through each seal pattern 22. The glass substrate 12 and the semiconductor substrate 10 are sawed into individual LCOS display panels along each scribe line 13 of the glass substrate 12 and each scribe line 11 of the semiconductor substrate 10. Then, a liquid crystal filling process is performed to fill the liquidcrystal molecules between the glass substrate 12 and the semiconductor substrate 10, so as to form a liquid crystal layer 24 between the glass substrate 12 and the semiconductor substrate 10 to finish individual LCOS display panel 16. Finally, a package process is performed to package individual LCOS display panel 16 into a display component of electric devices.

It is noted that the yields of forming the conductive photo-resist layer 18 on the glass substrate 12 and binding the glass substrate 12 onto the semiconductor substrate 10 are low. Therefore, the LCOS display panel 16 often has defects and the display quality of the panel is reduced or the panel is unable to display. With reference to FIG. 2, as for the unpackaged LCOS display panel 16, the conductive photo-resist layer 18 of the glass substrate 12 and the contact pad 26 of the semiconductor substrate 10 are located on opposite sides, but a prober commonly used at present cannot do an electrical test for such LCOS display panel 16. Accordingly, an LCOS display panel 16 having defects that are generated prior to the package process is often discovered after the package process, which increases the cost of the package process and reduces the quality of the package process. As a result, providing a die-level prober for testing an unpackaged LCOS display panel 16 is important for resolving the above problem.

SUMMARY OF INVENTION

An objective of the claimed invention is to provide a die-level prober for testing an unpackaged LCOS display panel in order to resolve the above problem.

The claimed invention provides a die-level prober for testing at least one unpackaged LCOS display panel, the unpackaged LCOS display panel having a first substrate, a second substrate, a liquid crystal layer positioned between the first substrate and the second substrate, at least one first contact pad positioned on the first substrate, and at least one second contact pad positioned on the second substrate. The die-level prober includes a chuck, a tray positioned on a surface of the chuck, and a probe card positioned above the tray. The tray includes at least a recession for situating at least one unpackaged LCOS display panel, and a conductive connecting structure positioned on one side of the recession, the connecting structure having a first portion for electrically contacting the first contact pad and a second portion for being electrically connected to the first portion. The probe card includes at least two probes for electrically contacting the second contact pad and the second portion respectively in order to test the electrical performance of the unpackaged LCOS display panel.

The die-level prober of the claimed invention includes the tray, and the tray includes the recession and the conductive connecting structure, so that each probe of the probe card can test the electrical performance of the unpackaged LCOS display panel with the connecting structure. Therefore, the die-level prober can test the display quality of the unpackaged LCOS display panel prior to performing a package process. As a result, the cost of the package process reduces and the yield of the package process increases.

DETAILED DESCRIPTION

Figure 3:
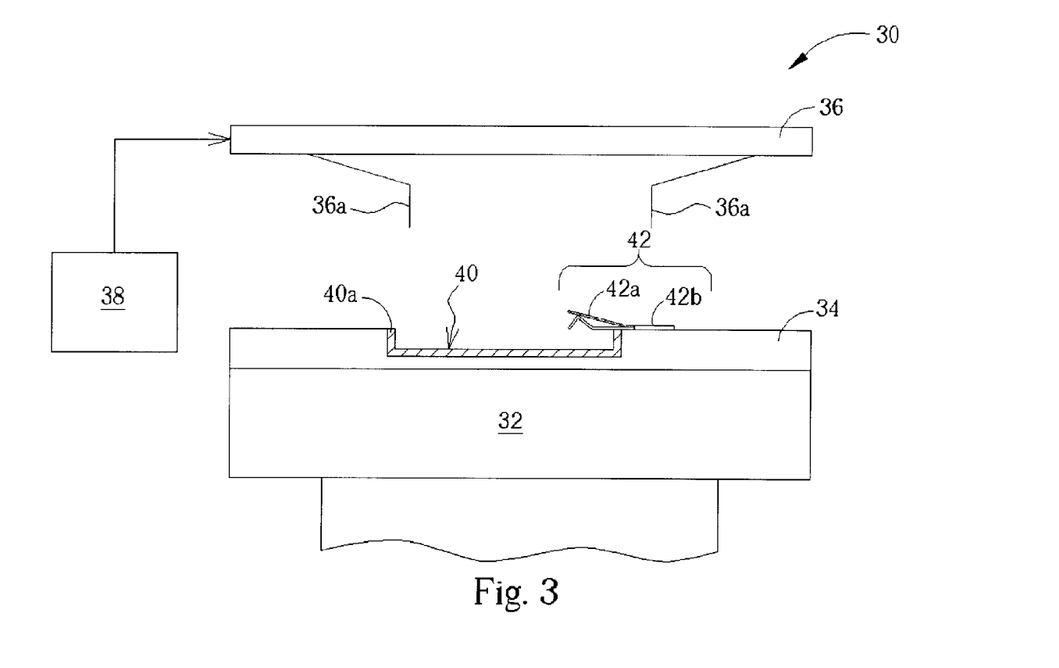
FIG. 3 and FIG. 5 show partial schematic drawings of the die-level prober according to a first embodiment of the present invention.
Figure 4:
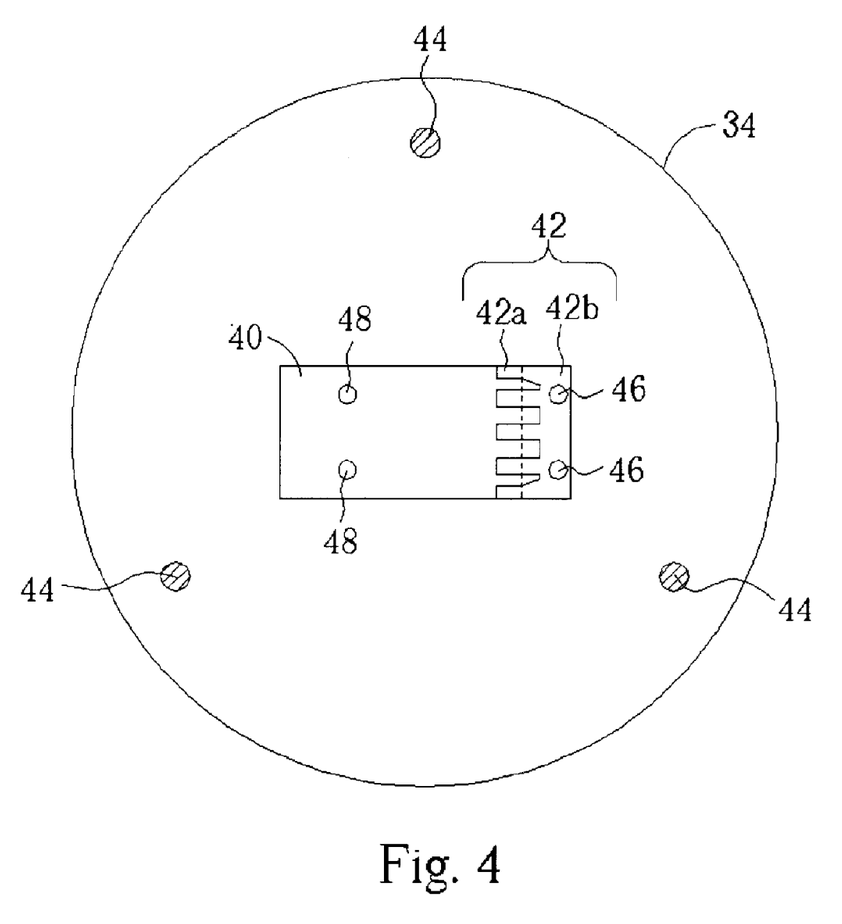
FIG. 4 shows a top view of the tray shown in FIG. 3.
Figure 5:
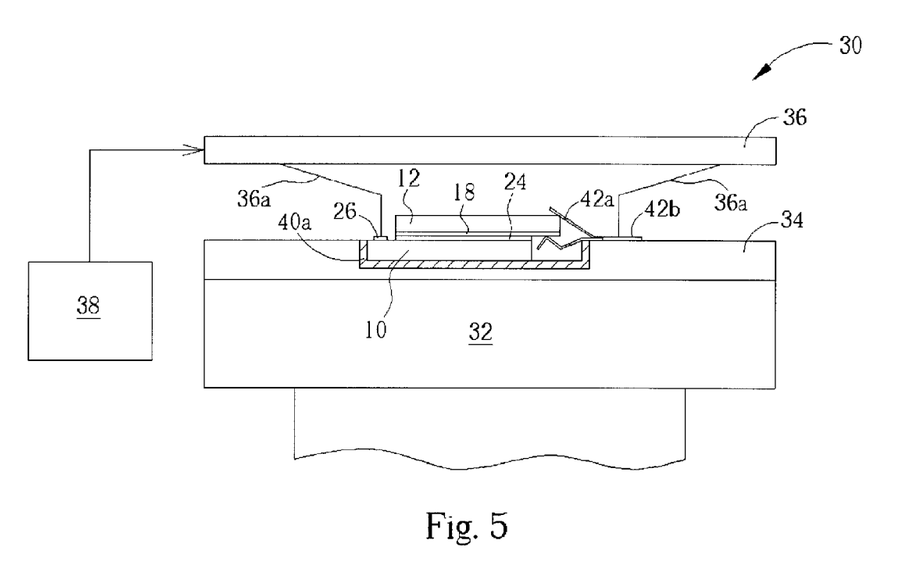

FIG. 3 and FIG. 5 show partial schematic drawings of a die-level prober 30 according to a first embodiment of the present invention. FIG. 4 shows a top view of atray34 shown in FIG. 3. With reference to FIG. 3, the die-level prober 30 includes a chamber (not shown in FIG. 3), a chuck 32 positioned in the chamber, the tray 34 positioned on a surface of the chuck 32, a probe card 36 positioned above the tray 34, and a control device 38 for controlling the probe card 36. The probe card 36 has a plurality of probes for electrically contacting a die to be tested. Furthermore, the die-level prober 30 also includes a positioning device (not shown in FIG. 3) for measuring the position of the chuck 32 or the tray 34, and making the chuck 32 or the tray 34 move to the correct position. The other detailed structures inside the die-level prober 30 are similar to the common die-level prober, such as the TSK UF200 manufactured by TOKYO SEIMITSU CO., so a detailed description is not provided.

With reference to FIG. 4 and FIG. 5, the tray 34 includes a recession 40 in the central spot for situating an unpackaged LCOS display panel 16, an insulant layer 40a covered in the recession 40, and a conductive connecting structure 42 positioned on one side of the recession 40. The connecting structure 42 has a first portion 42a and a second portion 42b electrically connected to the first portion 42a. In the first embodiment of the present invention, the first portion 42a comprising metal materials having extremely good conductivity, such as Au, is a conductive clamp, and the second portion 42b comprising Cu fixed on the tray 34 by a fixing device 46, such as a screw, is a contact pad. The insulant layer 40a comprises ceramic materials. The tray 34 also includes three guide pins 44 for fixing the tray 34 on a surface of the chuck 32 in a removable way, and two holes 48 positioned in the bottom of the recession 40 passing through the tray 34 to a surface of the chuck 32. Thus, during an electrical test, the vacuum in the die-level prober 30 engages the tray 34 with the unpackaged LCOS display panel 16 tightly to prevent the unpackaged LCOS display panel 16 from falling off.

With reference to FIG. 5, when performing the electrical test on the unpackaged LCOS display panel 16, the unpackaged LCOS display panel 16 should first be loaded into the recession 40 of the tray 34 by machine or hand, and then the glass substrate 12 should be clamped by the conductive clamp 42a. The conductive clamp 42a electrically contacts the conductive photoresist layer 18 of the glass substrate 12, and then, the tray 34 is fixed on the surface of the chuck 32. Then, a wafer alignment step is performed to make the contact pad 26 of the semiconductor substrate 10 locate in the correct examined position with the above-mentioned positioning device. It should be noted that the patterns adjacent to the contact pad 26 for alignment must be the same to ensure the precision of the wafer alignment step. Following, a needle alignment step is performed for calibrating the position of each needle 36a. After calibration, needles 36a are used to electrically contact the contact pad 26 and the contact pad 42b respectively. Finally, the control device 38 inputs a predetermined test program to the probe card 36. The probe card 36 inputs the electric signal to the contact pad 26 and the contact pad 42b through each probe 36a according to the predetermined test program. The contact pad 42b delivers the electric signal to the conductive photoresist layer 18 through the conductive clamp 42a for doing an electrical test of the unpackaged LCOS display panel 16. The result of the test is delivered back to the control device 38 by each probe 36a, and the control device 38 analyzes the result of the test.

Compared with the common die-level probers, the die-level prober 30 of the present invention has a dismantable tray 34. The tray 34 is equipped with a recession 40, a conductive clamp 42a, and a contact pad 42b. It should be noted that the conductive clamp 42a is electrically connected with the contact pad 42b on a surface of the tray 34, and electrically contacts the conductive photoresist layer 18 of the glass substrate 12. Therefore, the probes 36a of the probe card 36 can test the electrical performance of the unpackaged LCOS display panel 16 through the contact pad 26 and the contact pad 42b to determine whether the unpackaged LCOS display panel 16 could be used to display. If the result of the test shows the unpackaged LCOS display panel 16 could be used to display, the following package process should be performed, otherwise, the unpackaged LCOS display panel 16 should be directly discarded or a rework should be performed. As a result, the cost of the package process reduces and the yield of the package process increases.

Figure 6:
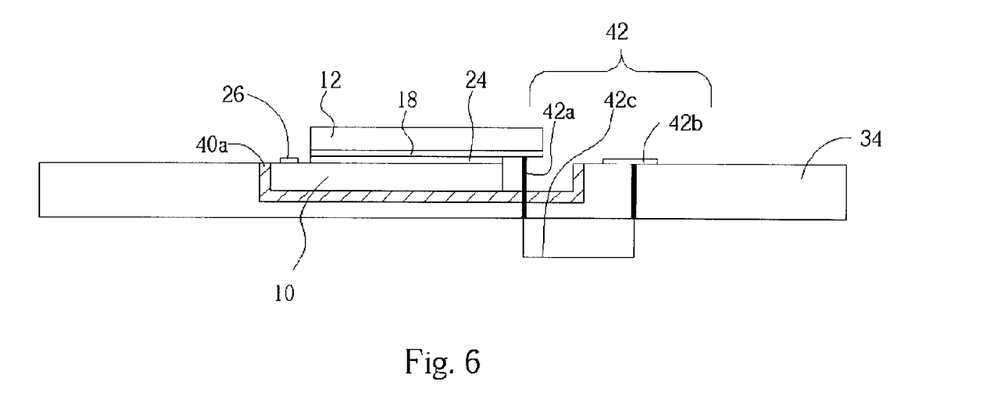
FIG. 6 shows a side view of the tray according to a second embodiment of the present invention.

However, the tray 34 shown in FIG. 3 to FIG. 5 is not the only embodiment of the present invention, and the following shows the other embodiments of the present invention. In the following, the same symbols represent the same parts for convenient description. With reference to FIG. 6, FIG. 6 shows a side view of the tray according to a second embodiment of the present invention. As shown in FIG. 6, the tray 34 includes a recession 40 in the central spot for situating an unpackaged LCOS display panel 16, an insulant layer 40a covered in the recession 40, and a conductive connecting structure 42 positioned on one side of the recession 40. The connecting structure 42 has a first portion 42a and a second portion 42b electrically connected to the first portion 42a. In the second embodiment of the present invention, the first portion 42a has at least one conductive probe, and the second portion 42a is a contact pad. Each probe 42a is used to electrically contact the conductive photoresist layer 18 of the glass substrate 12. Therefore, the probes 36a of the probe card 36 could be used to test the electrical performance of the unpackaged LCOS display panel 16 byelectrically contacting with the contact pad 26 and the contact pad 42b.

Figure 7:
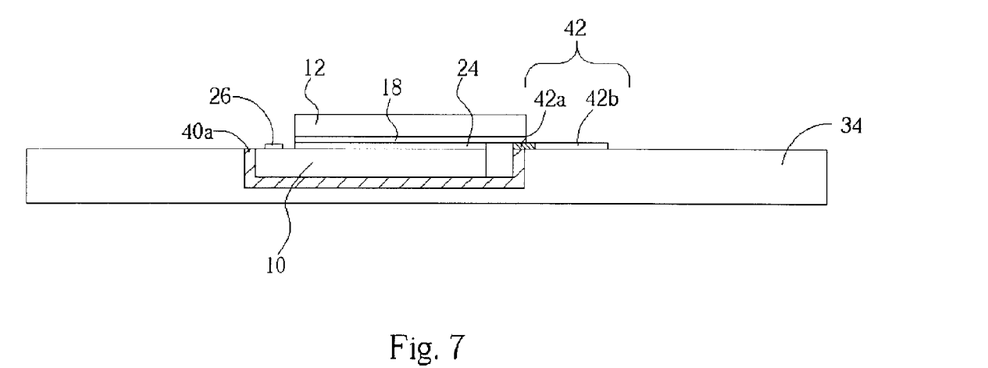
FIG. 7 shows a side view of the tray according to a third embodiment of the present invention.

With reference to FIG. 7, FIG. 7 shows a side view of the tray according to a third embodiment of the present invention. As shown in FIG. 7, the tray 34 includes a recession 40 in the central spot for situating an unpackaged LCOS display panel 16, an insulant layer 40a covered in the recession 40, and a conductive connecting structure 42 positioned on one side of the recession 40. The connecting structure 42 has a first portion 42a and a second portion 42b electrically connected to the first portion 42a. In the third embodiment of the present invention, the first portion 42a is a contact pad, and the second portion is a contact pad, too. The contact pad 42a is used to electrically contact the conductive photoresist layer 18 of the glass substrate 12. Therefore, the probes 36a of the probe card 36 could be used to test the electrical performance of the unpackaged LCOS display panel 16byelectrically contacting with the contact pad 26 and the contact pad 42b.

Figure 8:
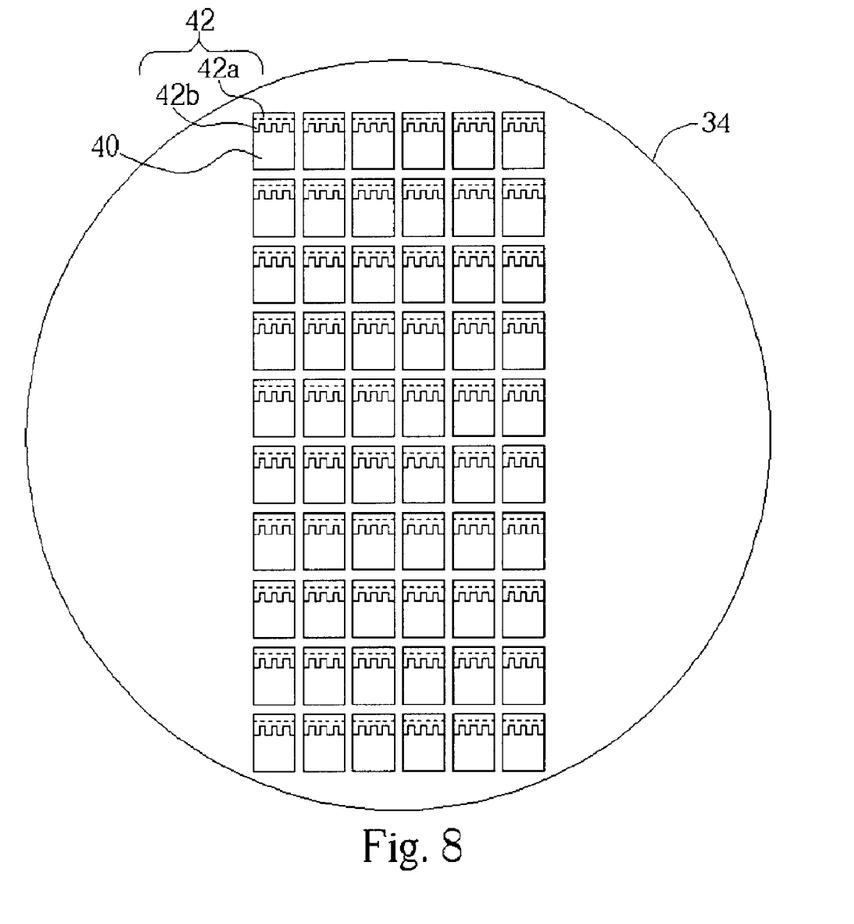
FIG. 8 shows a top view of the tray according to a fourth embodiment of the present invention.

With reference to FIG. 8, FIG. 8 shows a top view of the tray according to a fourth embodiment of the present invention. As shown in FIG. 8, the tray 34 includes a plurality of recessions 40 of a matrix arrangement in the tray 34, and a plurality of conductive connecting structures 42, each which is fixed on one side of each recession 40. It should be noted that each recession 40 is used for situating an unpackaged LCOS display panel 16, and each connecting structure 42 could be any one of the connecting structures shown in FIG. 3, FIG. 6, and FIG. 7. The die-level prober 30 of the first embodiment could load many unpackaged LCOS display panels 16 simultaneously, and then do electrical testing for each unpackaged LCOS display panel 16. Therefore, the time for replacing the tray 34 reduces. However, in order to ensure each unpackaged LCOS display panel 16 is in the correct position, electrical testing for each LCOS display panel 16 with the probe card 36 must be performed after a wafer alignment step.

Figure 9:
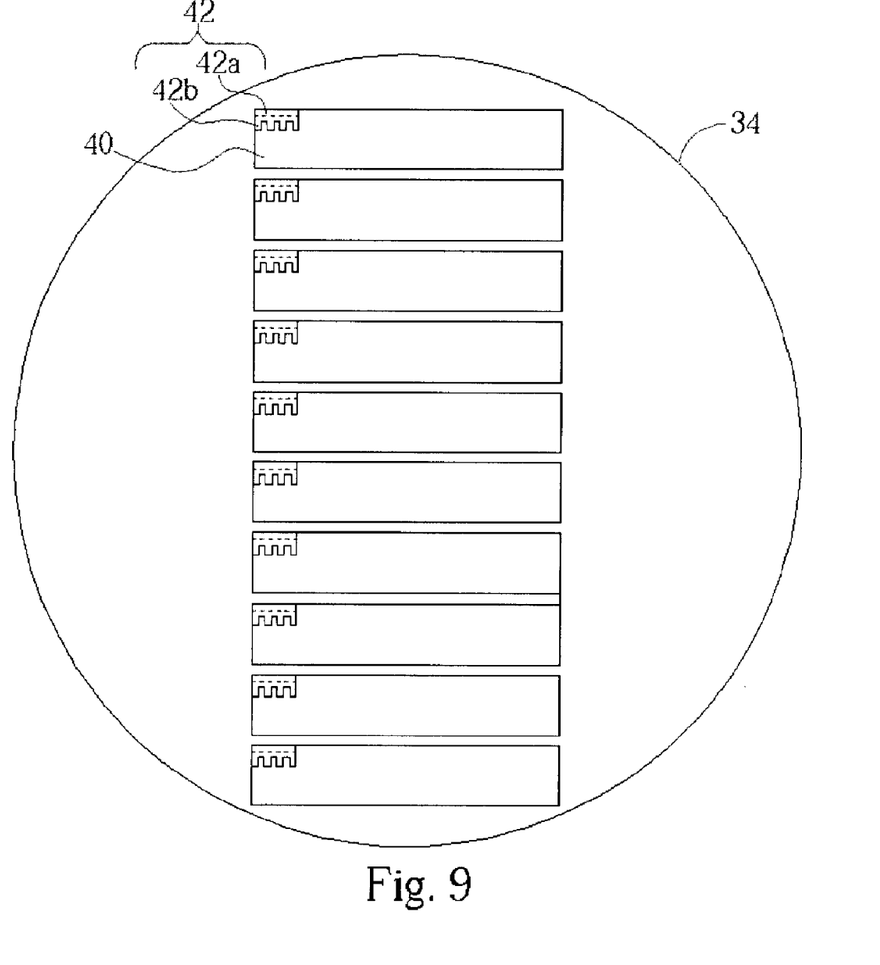
FIG. 9 shows a top view of the tray according to a fifth embodiment of the present invention.
Figure 10:
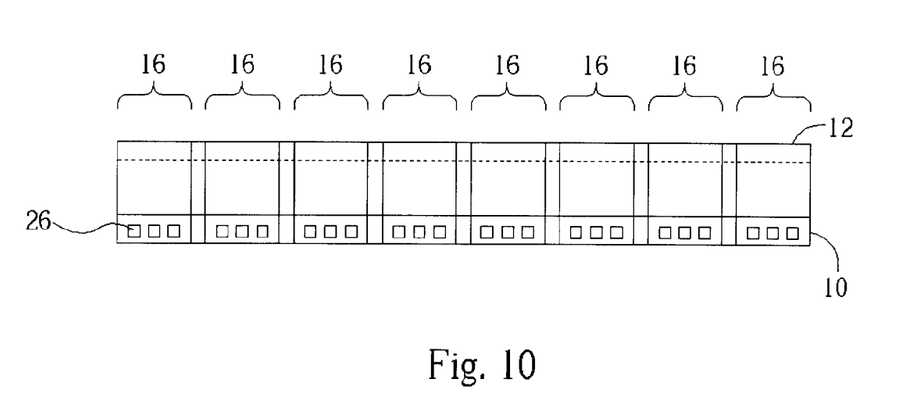
FIG. 10 shows a schematic diagram of for a plurality of connected unpackaged LCOS display panels.

FIG. 9 shows a top view of the tray according to a fifth embodiment of the present invention. FIG. 10 shows the schematic diagram of a plurality of connected unpackaged LCOS display panels. As shown in FIG. 9, the tray 34 includes a plurality of parallel recessions 40 in the tray 34, and a plurality of conductive connecting structures 42, each of which is fixed on one side of each recession 40. And as shown in FIG. 10, each recession 40 is used for situating a plurality of unpackaged LCOS display panels 16 that are electrically connected to each other. Each connecting structure 42 has a conductive clamp 42a and a contact pad 42b. It should be noted that the glass substrates 12 of each LCOS display panel 16 in each recession 40 are connected with each other. So the conductive clamp 42a just needs to clamp the glass substrate 12 of one of the LCOS display panels 16 in each recession 40. Then it could fix the tray 34 on a surface of the chuck 32, and do electrical testing for each LCOS display panel 16 in each recession 40. However, it should be noted that doing electrical testing for each LCOS display panel 16 with the probe card 36 must be performed after a wafer alignment step. Similarly, the die-level prober 30 of the first embodiment could load many LCOS display panels 16 simultaneously, then do electrical testing for each LCOS display panel 16. Thus, the time for replacing the tray 34 reduces. On the other hand, the conductive clamp 42a could be substituted for a conductive probe or a contact pad.

In the above embodiments, the first portion of the connecting structure 42 electrically contacts the conductive photoresist layer 18 of the glass substrate 12. However, the present invention is not restricted to that. The die-level prober 30 of the present invention also could load the LCOS display panel 16 into the recession 40 of the die-level prober in an inverted way in order to make the first portion 42a of the connecting structure 42 be electrically connected with the pad 26 on the semiconductor wafer 10. But at the time, a positioning device (not shown) is needed to make the first portion 42a align each pad on the semiconductor wafer 10 accurately.

Compared with the common die-level probers, the die-level prober 30 of the present invention has a dismantable tray 34. The tray is equipped with a recession 40, and a connecting structure 42 positioned on one side of the recession 40. Each probe 36a of the probe card 36 could electrically contacts the unpackaged LCOS display panel 16 by the connecting structure 42, so the die-level prober 30 of the present invention could do electrical testing for the unpackaged LCOS display panel 16. Thus, the die-level prober 30 could test the display quality of the unpackaged LCOS display panel 16 prior to performing a package process. As a result, the cost of the package process reduces and the yield of the package process increases.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A die-level prober for testing unpackaged liquid crystal on silicon (LCOS) display panels, each of which comprises a first substrate, a second substrate, a liquid crystal layer positioned between the first substrate and the second substrate, at least a first contact pad positioned on the first substrate, and at least a second contact pad positioned on the second substrate, the die-level prober comprising:

a chuck;

a tray positioned on a surface of the chuck comprising:
  at least a recession for situating at least one of the unpackaged LCOS display panels; and
  a conductive connecting structure positioned on one side of the recession, the connecting structure having a first portion for electrically contacting the first contact pad and a second portion electrically connected to the first portion; and a probe card positioned above the tray, the probe card having at least two probes for electrically contacting the second contact pad and the second portion respectively.

2. The die-level prober of claim 1 wherein the first substrate is partially lapped over the second substrate, and the first contact pad is located on a portion of the first substrate that is not lapped over the second substrate, while the second contact pad is located on a portion of the second substrate that is not lapped over the first substrate.

3. The die-level prober of claim 2 wherein the first substrate is a transparent substrate and the second substrate is a semiconductor wafer.

4. The die-level prober of claim 3 wherein the first contact pad is a conductive photoresist layer and the second contact pad is a bonding pad.

5. The die-level prober of claim 2 wherein the first substrate is a semiconductor wafer and the second substrate is a transparent substrate.

6. The die-level prober of claim 5 wherein the first contact pad is a bonding pad and the second contact pad is a conductive photoresist layer.

7. The die-level prober of claim 1 wherein the second portion of the connecting structure is a third contact pad positioned on a surface of the tray.

8. The die-level prober of claim 7 wherein the first portion of the connecting structure is a conductive clamp.

9. The die-level prober of claim 7 wherein the first portion of the connecting structure comprises at least one conductive probe.

10. The die-level prober of claim 7 wherein the first portion of the connecting structure is a fourth contact pad positioned on the surface of the tray.

11. The die-level prober of claim 1 wherein each tray is utilized to situate one of the unpackaged LCOS display panels.

12. The die-level prober of claim 1 wherein each tray is utilized to simultaneously situate the unpackaged LCOS display panels that are electrically connected to each other.

13. A die-level prober for testing unpackaged dies, each of which comprises at least a first contact pad and a second contact pad, the die-level prober comprising:

a chuck;

a tray positioned on a surface of the chuck comprising:
  at least a recession for situating at least one of the unpackaged dies; and
  a conductive connecting structure positioned on one side of the recession, the connecting structure having a first portion for electrically contacting the first contact pad and a second portion electrically connected to the first portion; and a probe card positioned above the tray, the probe card having at least two probes for electrically contacting the second contact pad and the second portion respectively.

14. The die-level prober of claim 13 wherein each of the unpackaged dies is an unpackaged liquid crystal on silicon (LCOS) display panel.

15. The die-level prober of claim 14 wherein the unpackaged LCOS display panel comprises:
a transparent substrate;
a semiconductor wafer partially lapped over the transparent substrate;
a liquid crystal layer positioned between the transparent substrate and the semiconductor wafer;
a conductive photoresist layer positioned on a surface of the transparent substrate, a portion of the conductive photoresist layer being located between the liquid crystal layer and the transparent substrate; and
at least a bonding pad positioned on a surface of the semiconductor wafer that is not lapped over the transparent substrate.

16. The die-level prober of claim 15 wherein the first contact pad is the conductive photoresist layer and the second contact pad is the bonding pad.

17. The die-level prober of claim 15 wherein the first contact pad is the bonding pad and the second contact pad is the conductive photoresist layer.

18. The die-level prober of claim 15 wherein the second portion of the connecting structure is a third contact pad positioned on a surface of the tray.

19. The die-level prober of claim 18 wherein the first portion of the connecting structure is a conductive clamp.

20. The die-level prober of claim 18 wherein the first portion of the connecting structure comprises at least one conductive probe.

21. The die-level prober of claim 18 wherein the first portion of the connecting structure is a fourth contact pad positioned on the surface of the tray.

22. The die-level prober of claim 13 wherein each tray is utilized to situate one of the unpackaged dies.

23. The die-level prober of claim 13 wherein each tray is utilized to simultaneously situate the unpackaged dies that are electrically connected to each other.

* * * * *